US009354286B2

(12) United States Patent
Biber

(10) Patent No.: US 9,354,286 B2
(45) Date of Patent: May 31, 2016

(54) LOCAL COIL ARRANGEMENT HAVING INTEGRATED SHIM CONDUCTOR

(75) Inventor: Stephan Biber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 792 days.

(21) Appl. No.: 13/586,697

(22) Filed: Aug. 15, 2012

(65) Prior Publication Data

US 2013/0207655 A1 Aug. 15, 2013

(30) Foreign Application Priority Data

Aug. 16, 2011 (DE) .......................... 10 2011 081 039

(51) Int. Cl.
| G01R 33/30 | (2006.01) |
| G01R 33/341 | (2006.01) |
| G01R 33/3875 | (2006.01) |
| G01R 33/34 | (2006.01) |
| G01R 33/3415 | (2006.01) |

(Continued)

(52) U.S. Cl.
CPC .............. *G01R 33/30* (2013.01); *G01R 33/341* (2013.01); *G01R 33/3875* (2013.01); *G01R 33/3415* (2013.01); *G01R 33/34046* (2013.01); *G01R 33/5607* (2013.01); *G01R 33/56563* (2013.01)

(58) Field of Classification Search
CPC .... G01R 33/3415; G01R 33/28; G01R 33/34; G01R 33/34046; G01R 33/34084; G01R 33/4828; G01R 33/5607
USPC ................... 324/318, 321, 322; 600/410, 422
See application file for complete search history.

(56) References Cited

U.S. PATENT DOCUMENTS 5,173,661 A * 12/1992 Knuttel et al. ................. 324/309
6,100,695 A * 8/2000 DeMeester et al. .......... 324/318

(Continued)

FOREIGN PATENT DOCUMENTS

CN 1367378A A 9/2002
CN 101495882A A 7/2009

(Continued)

OTHER PUBLICATIONS

German Office Action dated May 23, 2012 for corresponding German Patent Application No. DE 10 2011 081 039.0 with English translation.

(Continued)

*Primary Examiner* — Melissa Koval
*Assistant Examiner* — Rishi Patel
(74) *Attorney, Agent, or Firm* — Lempia Summerfield Katz LLC

(57) ABSTRACT

When a portion of a structure enclosing a local coil is inserted in a homogeneity region of a basic magnetic field of a magnetic resonance system, the local coil is operable to receive magnetic resonance signals originating from a specific detection zone for the local coil arrangement. At least one conductor is arranged in the structure. Field lines of a compensation magnetic field generated by current encircling the conductor form a compensation magnetic field angle with the basic magnetic field in an edge area of the detection zone. Return conductors complete an electric circuit containing the conductor and extend in the direction of the basic magnetic field and/or are arranged such that field lines of an interfering magnetic field counteracting the compensation magnetic field encircle the respective return conductor and form an interfering magnetic field angle with the basic magnetic field in the edge area.

16 Claims, 3 Drawing Sheets

(51) Int. Cl.
   *G01R 33/56* (2006.01)
   *G01R 33/565* (2006.01)

(56) References Cited

U.S. PATENT DOCUMENTS

| | | |
|---|---|---|
| 6,396,268 B1 | 5/2002 | Hinks et al. |
| 2008/0214930 A1 | 9/2008 | Brasile |
| 2009/0209842 A1 | 8/2009 | Koevoets et al. |
| 2010/0099978 A1 | 4/2010 | Geppert et al. |
| 2011/0082043 A1 | 4/2011 | Wang et al. |

FOREIGN PATENT DOCUMENTS

| | | |
|---|---|---|
| CN | 101552077A A | 10/2009 |
| DE | 39 37 150 A1 | 5/1991 |
| DE | 10 2008 048 291 A1 | 4/2010 |

OTHER PUBLICATIONS

C. Juchem et al., "Multi-Coil Shimming of the Mouse Brain," Proc. Intl. Soc. Mag. Reson. Med. 19, p. 97, 2011.

M. L. Jayatilake et al., "Construction and optimization of local $3^{rd}$ order passive shim system for human brain imaging at 4T MRI," Proc. Intl. Soc. Mag. Reson. Med. 19, p. 3785, 2011.

C. Juchem et al., "Dynamic Multi-Coil Shimming of the Human Brain at 7 Tesla," Proc. Intl. Soc. Mag. Reson. Med. 19, p. 716, 2011.

S. K. Lee et al., "B0 Shimming in 3 T Bilateral Breast Imaging with Local Shim Coils," Proc. Intl. Soc. Mag. Reson. Med. 19, p. 715, 2011.

R. Salomir et al., "A Fast Calculation Method for Magnetic Field Inhomogeneity due to an Arbitrary Distribution of Bulk Susceptibility," 2003 Wiley Periodicals, Inc., pp. 26-34, 2003.

Chinese Office action for related Chinese Application No. 2012102923750, dated Nov. 04, 2015, with English Translation.

\* cited by examiner

LOCAL COIL ARRANGEMENT HAVING INTEGRATED SHIM CONDUCTOR

This application claims the benefit of DE 10 2011 081 039.0, filed on Aug. 16, 2011.

BACKGROUND

The present embodiments relate to a local coil arrangement for magnetic resonance purposes.

A type of local coil arrangement is known, for example, from DE 10 2008 048 291 A1 or corresponding US 2010/099978 A1.

Imaging in magnetic resonance tomography is based on the spins of atomic nuclei aligned in a static basic magnetic field. For many applications, the homogeneity of the basic magnetic field is of significance for the image quality and also for the spatial registration of the images (e.g., distortion). In addition, the use of fat saturation techniques is relevant for numerous imaging techniques. With fat saturation techniques, the fatty tissue that emits a strong signal in many types of contrast is masked out. The masking out of the fatty tissue is a factor for the diagnostic usefulness of the magnetic resonance images, since with many types of sequences, pathological tissue displays a similar or even identical contrast behavior to the contrast behavior of fat.

Various methods for fat saturation are known from the prior art (e.g., Dixon or spectral fat saturation). Spectral fat saturation and related techniques utilize the fact that, with the same basic magnetic field, fat and water have slightly different resonance frequencies (e.g., deviation of about 3 ppm). A strong, sufficiently narrow-band transmission pulse at the exact fat frequency is, therefore, able to suppress the signal from fat without exerting a negative influence on the imaging of the protons belonging to the water molecules. However, a factor for the operational reliability of all techniques based on the spectral separation of fat and water is the homogeneity of the basic magnetic field, since the Larmor frequency is determined by the product of the gyromagnetic ratio and the basic magnetic field. If the basic magnetic field varies with a similar order of magnitude as the chemical shift or to a greater degree, the fat resonances and water resonances overlap, so the spectra may no longer be differentiated from each other.

Supra-conductive magnetic systems from the prior art enable magnetic field homogeneity with deviations of 1 ppm and less to be achieved within a volume measuring approximately 30 cm to 40 cm in diameter and 50 cm in length. Problems with respect to the spectral separation of water and fat may, therefore, occur in primarily extreme regions of the anatomy (e.g., the shoulder) that, due to the lack of space in an examination tunnel of a magnetic resonance device, may not be positioned centrally.

The inhomogeneities introduced by the tissue of the actual patient are more critical than the pre-known and deterministic inhomogeneities of the basic magnetic field. This is because human tissue has a relative magnetic permeability that differs, even if only slightly, from 1.0. As a result, for example, the discontinuities from air to tissue and vice versa cause severe distortion of the basic magnetic field. The inhomogeneous distribution of, for example, water, air, bone, and fat in the human body also causes distortion of the basic magnetic field. Such patient-induced distortion is individual to each patient and hence may not be compensated in advance.

It is known from the article "Construction and optimization of local 3rd order passive shim system for human brain imaging at 4T MRI," by M. L. Jayatilake et al., Proc. Intl. Soc. Mag. Reson. Med. 19 (2011), page 3785, how to compensate residual inhomogeneity of the basic magnetic field using a passive shim coil. The shim coil used has dimensions of about 36 cm in diameter and length.

It is known from the article "Multi-Coil Shimming of the Mouse Brain," by C. Juchem et al., Proc. Intl. Soc. Mag. Reson. Med. 19 (2011), page 97, how to surround the object under examination with a plurality of active shim coils and to set the shim currents of the shim coils individually in order to at least partially compensate the residual inhomogeneity. A similar disclosure may be found in the article "Dynamic Multi-Coil Shimming of the Human Brain at 7 Tesla," by C. Juchem et al., Proc. Intl. Soc. Mag. Reson. Med. 19 (2011), page 716.

It is known from the article "B0 Shimming in 3 T Bilateral Breast Imaging with Local Shim Coils," by S-K. Lee et al., Proc. Intl. Soc. Mag. Reson. Med. 19 (2011), page 715, how to arrange a shim coil in a breast coil arrangement and to use the shim coil for the compensation of residual inhomogeneity of the basic magnetic field.

For example, in the case of air-tissue transitions, the distortion of the basic magnetic field by the patient is strong and very spatially localized. Due to the strong spatial localization, the established methods are not suitable for the homogenization of the basic magnetic field.

In the prior art, the shim coils integrated in the magnetic resonance system are used to compensate the spatial variations of the basic magnetic field individually for each patient (e.g., following a calibration measurement). However, the shim coils known from the prior art are only able to compensate large areas of inhomogeneity. In the prior art, homogenization cushions are used for strongly localized effects. The cushions are made of a weakly diamagnetic material and displace the discontinuity from the air-tissue boundary to the air-cushion boundary in order to defuse the problem. However, the cushions result in additional distance between local coil and the patient and hence reduce the signal-noise ratio. In addition, the cushions may not be adapted to the specific inhomogeneity of the patient. The positioning of the cushions in the medical workflow is perceived as a drawback. The action of the cushions is heavily dependent on precise positioning, and the cushions are heavy.

SUMMARY AND DESCRIPTION

The present embodiments may obviate one or more of the drawbacks or limitations in the related art. For example, a local coil arrangement, with which locally narrowly restricted residual inhomogeneities may be compensated in a simple manner without unacceptable side effects at other points, is provided.

In one embodiment of a local coil arrangement, at least one conductor is arranged in a mechanical holding structure. The at least one conductor may be exposed to direct current or to low-frequency alternating current. The at least one conductor is arranged in the mechanical holding structure, such that the at least one conductor extends orthogonally to a direction of the basic magnetic field. Field lines of a compensation magnetic field generated when the at least one conductor is exposed to direct current or low-frequency alternating current encircle the conductor and form a compensation magnetic field angle with the direction of the basic magnetic field in an edge area of the detection zone. Return conductors required to complete an electric circuit containing the at least one conductor extend in the direction of the basic magnetic field and/or are arranged such that field lines of an interfering magnetic field generated on the exposure of the at least one conductor to direct current or low-frequency alternating current and counteracting the compensation magnetic field encircle the respective return conductor. The field lines of the interfering magnetic field form an interfering magnetic field angle with the direction of the basic magnetic field in the edge area. The interfering magnetic field angle is at least as large as the compensation magnetic field angle, and the respective return conductor is further away from the edge area than the at least one conductor.

Therefore, unlike in the prior art, the part of the magnetic field that extends substantially orthogonally to the conductor loop formed by the at least one conductor and the return conductors is not used. Instead, only the compensation magnetic field encircling the conductor is used. The other magnetic fields either extend orthogonally to the basic magnetic field and therefore remain virtually ineffective or are much smaller than the compensation magnetic field. Thus, the compensation magnetic field is only attenuated to an insignificant degree.

In one embodiment, the at least one conductor is arranged outside the detection zone at the edge of the edge region. This measure achieves good localization of the compensation magnetic field.

The at least one conductor and the return conductors may lie substantially in a plane, and with a parallel projection of the edge region directed orthogonally to the plane into the plane, the at least one conductor is arranged between at least a part of the edge region and the return conductors with an interfering magnetic field that counteracts the compensation magnetic field. This results in particularly low attenuation of the compensation magnetic field by the corresponding interfering magnetic field.

In one embodiment, viewed in the direction of the basic magnetic field, the detection zone has a maximum extension. Viewed in the direction of the basic magnetic field, a distance of the return conductors with an interfering magnetic field that counteracts the compensation magnetic field from the edge area is at least as large as the maximum extension of the detection zone. The corresponding return conductor is arranged far enough from the edge area to provide that a negative influence on the edge region from the corresponding return conductor is practically excluded.

In one embodiment, at least one band-stop filter matched to the Larmor frequency of the magnetic resonance system and/or at least one choke are arranged in the electric circuit containing the conductor and the return conductors. This embodiment enables the influence of the control of a high-frequency transmission coil or a gradient coil on the electric circuit to be minimized.

The local coil arrangement may, for example, be embodied as a breast coil arrangement including two cup-shaped receptacles for the breasts of the object under examination. In this case, the detection zone may encompass at least one of the cup-shaped receptacles in each case. The at least one conductor may be arranged in the region of the lower edge of the cup-shaped receptacles.

Alternatively, the local coil arrangement may be embodied as a spine arrangement. In this case, the at least one conductor may be arranged in the region of the mechanical holding structure, on which the neck of the object under examination lies.

DETAILED DESCRIPTION OF THE DRAWINGS

Figure 1:
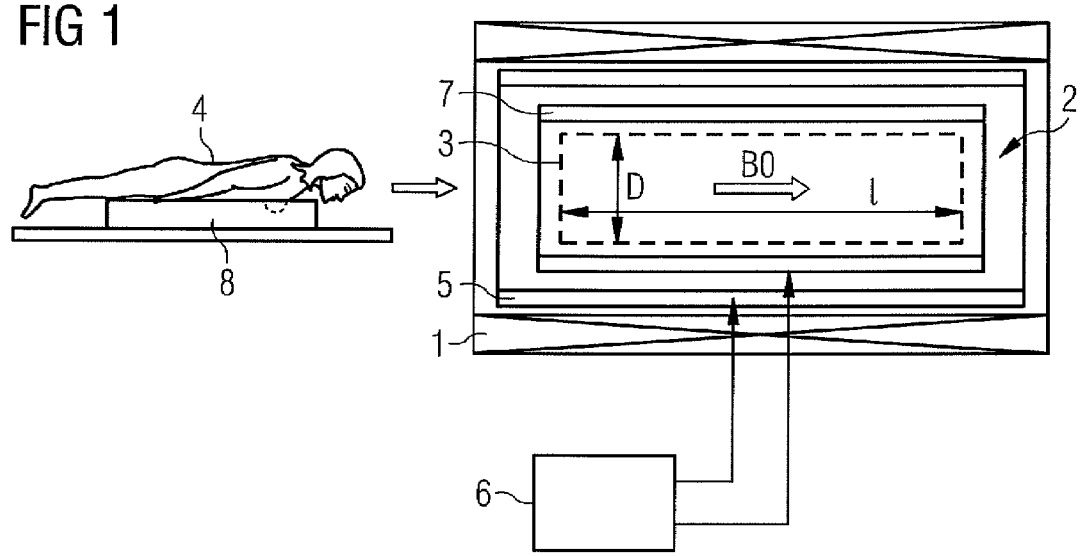
FIGS. 1 and 2 each show one embodiment of a magnetic resonance system with a local coil arrangement.
Figure 2:
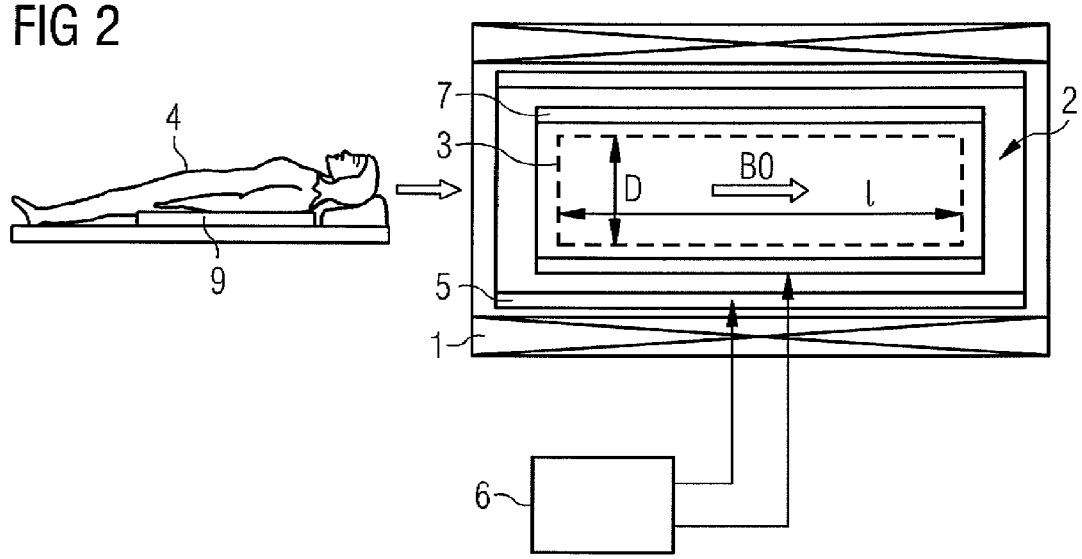

As shown in FIGS. 1 and 2, one embodiment of a magnetic resonance system includes a basic magnet 1. The basic magnet 1 is used to generate a temporally static, locally substantially homogeneous basic magnetic field B0 in an examination volume 2 of the magnetic resonance system. The basic magnetic field B0 may, for example, have a strength of 1.5 T or 3 T in a homogeneity region 3. The homogeneity region 3 is identical to the examination volume 2 or is a subarea of the examination volume 2. The homogeneity region 3 may, for example, have a diameter D of about 35 cm and a length l of from 1 to 50 cm. A residual inhomogeneity of the basic magnetic field B0 (e.g., without an object under examination 4 being located in the homogeneity region 3) may be about 1 ppm. The residual inhomogeneity is greatest at an edge of the homogeneity region 3.

The magnetic resonance system also includes a gradient magnetic system 5. The gradient magnetic system 5 may be used to expose the examination volume 2 to a gradient field. The gradient magnetic system 5 is controlled by a control device 6 with corresponding gradient currents. The gradient currents are low-frequency. The gradient currents are switched at frequencies of less than 5 kHz (e.g., even less than 1 kHz).

The magnetic resonance system includes a whole body coil 7. The whole body coil 7 may be used to expose the examination volume 2 (e.g., the homogeneity region 3) to high-frequency excitation pulses. Depending upon the basic magnetic field B0 and the type of nucleus to be excited, the frequency of the excitation pulse lies within the one-digit to three-digit MHz range. For example, the Larmor frequency of hydrogen in a 3 tesla system is about 127 MHz. The whole body coil 7 is also controlled by the control device 6.

Figure 3:
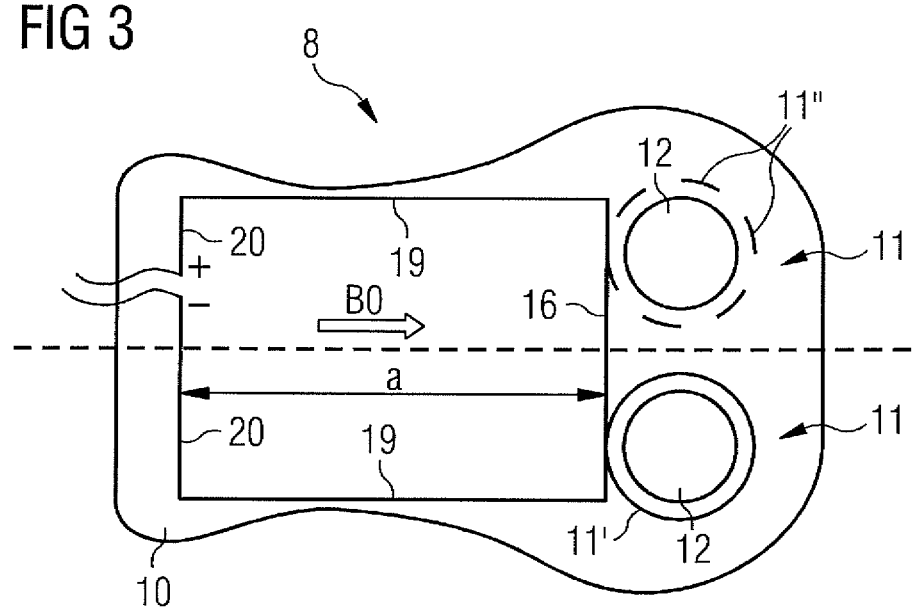
FIGS. 3 and 4 show embodiments of the local coil arrangement from FIG. 1 from above and from the side, respectively.

The whole body coil 7 may also be used for the detection of excited magnetic resonance signals. However, the detection of the magnetic resonance signals is performed by local coil arrangements 8, 9. FIGS. 1 and 2 each show, by way of example, a local coil arrangement 8, 9. The local coil arrangement 8 in FIG. 1 (see also FIGS. 3 and 4) is embodied as a breast coil arrangement. The local coil arrangement 9 in FIG. 2 is (see also FIGS. 5 and 6) embodied as a spine coil arrangement.

Each of the local coil arrangements 8, 9 includes a mechanical holding structure 10. The mechanical holding structure 10 is made of a material that is transparent for magnetic resonance applications. Suitable materials (e.g., plastics) are known by the person skilled in the art.

In each case, at least one local coil 11, 14 is arranged in the mechanical holding structure 10 of the local coil arrangements 8, 9. For example, the breast coil arrangement 8 in FIGS. 1, 3 and 4 includes two cup-like receptacles 12, in which the breasts of the object under examination 4 (e.g., a woman) are disposed. The object under examination 4 lies prone on the breast coil arrangement 8. A local coil 11 is arranged in the region of each of the cup-like receptacles 12. For example, each cup-like receptacle 12 may be surrounded by a volume coil 11' or a plurality of array coils 11", as is the case in DE 10 2008 048 291 A1. The respective local coil 11', 11" detects a magnetic resonance signal originating from the region of the respective cup-liked receptacle 12 and, for example, from the immediately adjacent region. This detection zone 13 is indicated by dashed lines in FIGS. 3 and 4. The detection zone 13 is specific for the respective local coil 11', 11'' and hence also specific for the local coil arrangement 8. With the breast coil arrangement 8, the detection zone 13 encompasses one of the cup-shaped receptacles 12 in each case.

Figure 5:
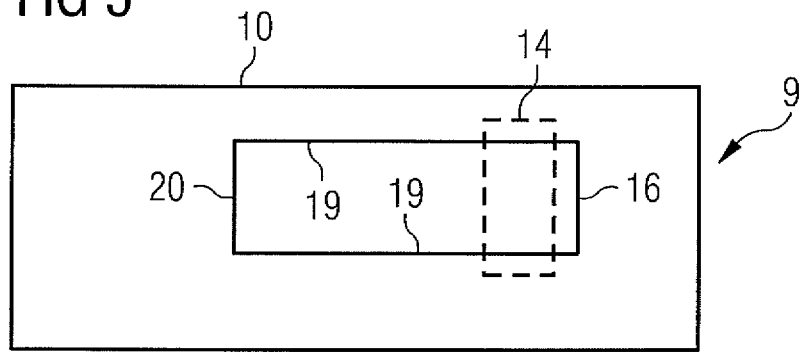
FIGS. 5 and 6 show embodiments of the local coil arrangement from FIG. 2 from above and from the side, respectively.
Figure 6:
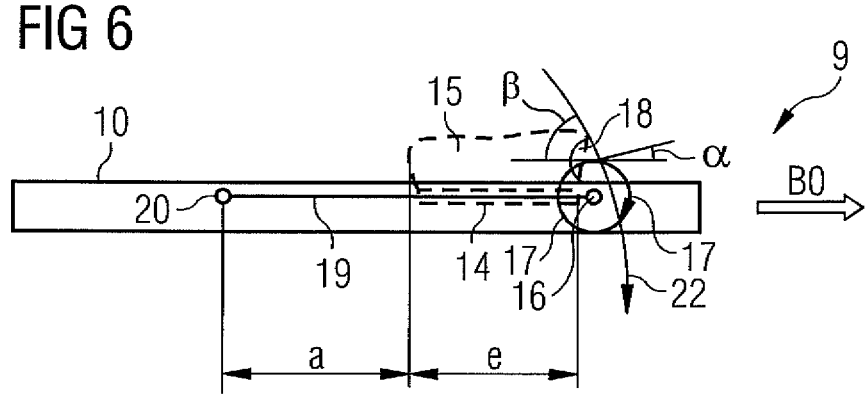

The spine coil arrangement 9 in FIGS. 2, 5 and 6 also encompasses at least one local coil 14. The at least one local coil 14 is a volume coil (e.g., a circular conductor loop). Alternatively or additionally, the at least one local coil 14 may, for example, be a butterfly coil. One of the local coils 14 is also shown purely by way of example in FIGS. 5 and 6. The local coil 14 is arranged substantially horizontally. The associated detection zone 15 of the local coil 14 is substantially disposed above the respective local coil 14 (e.g., the local coil 14 of the spine coil arrangement 9 may substantially receive a magnetic resonance signal originating from the region above the respective local coil 14). The detection zone 15 is also specific for the respective local coil arrangement 9 (e.g., the spine coil arrangement). In FIGS. 5 and 6, the corresponding detection zone 15 is again indicated by dashed lines.

The detection of magnetic resonance signals by the corresponding local coils 11, 14 is only possible when the object under examination 4 is lying on the corresponding mechanical holding structure 10, and the entirety of or at least a portion of the mechanical holding structure 10 surrounding the local coil 11, 14 in question is inserted in the homogeneity region 3 of the basic magnet field B0. Another receive coil (e.g., the whole body coil 7) may also be used.

The basic magnetic field B0 also has residual inhomogeneity in the homogeneity region 3. In one embodiment, the object under examination 4 may cause or intensify object-specific individual inhomogeneities of the basic magnet field B0. In many magnetic resonance applications, the inhomogeneities are not critical. In other magnetic resonance applications, the inhomogeneities are not acceptable. Examples of magnetic resonance applications of this kind include chemical shift and fat saturation techniques.

In order to compensate inhomogeneities of the basic magnetic field B0, at least one conductor 16 is arranged in the mechanical holding structure 10. According to FIGS. 3 to 6, the at least one conductor 16 is arranged in the mechanical holding structure 10 such that the at least one conductor 16 extends orthogonally to the direction of the basic magnetic field B0. In one embodiment, the at least one conductor 16 may extend horizontally.

The at least one conductor 16 (see FIGS. 3 to 6) may be exposed to direct current or low-frequency alternating current. Exposure to direct current is sufficient if compensation of the inhomogeneities of the basic magnetic field B0 independently of the control status of the gradient magnetic system 5 is sufficient. Otherwise, the at least one conductor 16 is exposed to a low-frequency alternating current. The switchover of the respective current level is coordinated with the control of the gradient magnetic system 5. In this context, "low-frequency alternating current" is not a sinusoidal alternating current, but a step-wise varying current that is changed in accordance with the control of the gradient magnetic system 5 or, more generally, the pulse sequence.

The exposure of the conductor 16 to direct current or low-frequency alternating current causes a magnetic field to form. Field lines 17 of the magnetic field encircle the conductor 16. This magnetic field is hereinafter designated as a compensation magnetic field. The field lines 17 of the compensation magnetic field form an angle α (e.g., a compensation magnetic field angle α) with the direction of the basic magnetic field B0 in an edge area 18 of the detection zone 13, 15. The compensation magnetic field angle α is an acute angle formed by the field lines 17 of the compensation magnetic field with the basic magnetic field B0 and, to be precise, independently of whether the compensation magnetic field acts additively or subtractively on the basic magnetic field B0. If possible, the compensation magnetic field angle α may be close to 0° but is not close to 90°.

To enable current to flow in the conductor 16, an enclosed electric circuit is provided. Return conductors 19, 20 are provided to form a complete electric circuit together with the conductor 16. The current flowing in the return conductors 19, 20 is the same as the current flowing in the conductor 16. Therefore, a respective magnetic field also forms around the return conductors 19, 20 with field lines 22 encircling the respective return conductors 19, 20. These magnetic fields will hereinafter be designated interfering magnetic fields.

If, as is the case with the return conductors 19, the return conductors 19, 20 extend in the direction of the basic magnetic field B0, field lines of the corresponding interfering magnetic field extend orthogonally (or substantially orthogonally) to the basic magnetic field B0. Therefore, the return conductors 19, 20 have a negligible influence on the basic magnetic field B0.

If, as is the case with the return conductors 20, the return conductors 19, 20 do not extend in parallel (or substantially in parallel) to the basic magnetic field B0, the return conductors 19, 20 extend orthogonally or substantially orthogonally to the basic magnetic field B0. For example, the return conductors 19, 20 may extend in parallel to the conductor 16. The corresponding return conductors 20 generate an interfering magnetic field that counteracts the compensation magnetic field. However, according to FIGS. 3 to 6, the corresponding return conductors 20 are further away from the edge area 18 than the conductor 16. In addition, the field lines 22 of the corresponding interfering magnetic field form angle β (e.g., designated the interfering magnetic field angle β) with the direction of the basic magnetic field B0 in the edge area 18, for which the inhomogeneity is to be compensated. The interfering magnetic field angle β is at least as large as the compensation field angle α. In one embodiment, the interfering magnetic field angle β is close to 90°.

Due to the circumstances that the distance of the corresponding return conductor 20 from the edge area 18 is greater than the of the conductor 16 from the edge area 18 and that the interfering magnetic field angle β is larger than the compensation magnetic field angle α, the influence of the corresponding interfering magnetic field on the basic magnetic field B0 is significantly less than the influence of the compensation magnetic field. Thus, the compensation effect of the compensation magnetic field is substantially retained. The current in the electric circuit of the conductor 16 and the return conductors 19, 20 may therefore be set, such that the compensation magnetic field compensates or at least substantially compensates the local field inhomogeneity of the basic magnetic field B0 in the edge area 18 of the detection zone 13, 15.

The arrangement of the conductor 16 may be determined as required. In one embodiment, although the conductor 16 is arranged, as shown in FIGS. 3 to 6, outside the detection zone 13 or 15 except for an edge of the edge region 18 (e.g., in the case of the breast coil arrangement 8 in FIGS. 1, 3 and 4), the conductor 16 may be arranged in the region of a lower edge (e.g., a foot-end) of the cup-shaped receptacles 12. In the case of the spine coil arrangement 9 in FIGS. 2, 5 and 6, the conductor 16 may be arranged in a region of the mechanical pickup coil 10, on which the neck of the object under examination 4 lies.

Figure 4:
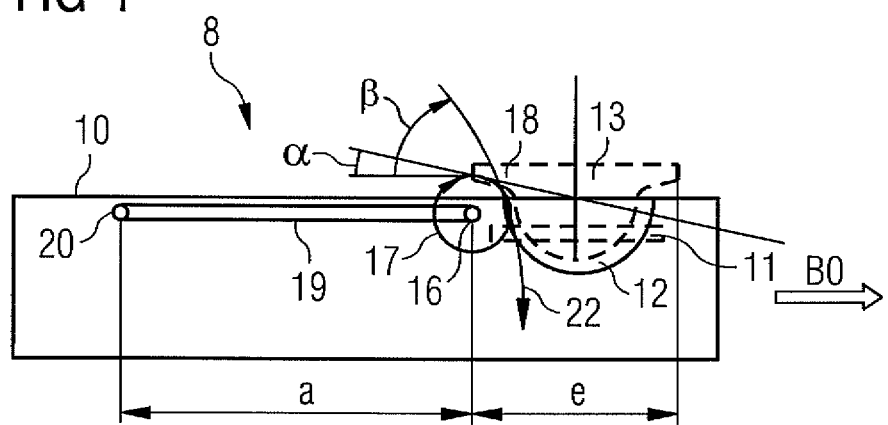

The conductor 16 and the return conductors 19, 20 may lie in a plane. The plane may extend horizontally, as shown in FIGS. 4 and 6. Alternatively, the plane may extend obliquely. If a parallel projection of the edge region 18 of the detection zone 13, 15 directed orthogonally to the corresponding plane is performed, the conductor 16 may be arranged between the edge area 18 or at least a part of the edge region 18 and the return conductors 20 having an interfering magnetic field that counteracts the compensation magnetic field. For example, the conductor 16 may, relative to the projection, be arranged "over" or "under" the edge area 18 and the corresponding return conductors 20 "far away" from the edge area.

Viewed in the direction of the basic magnetic field B0, the detection zone 13, has a maximum extension e. The maximum extension e is determined by the respective local coil 11, 14. Depending upon the local coil 11, 14, the maximum extension e may be from a few millimeters to more than 20 cm. Viewed in the same direction (e.g., in the direction of the basic magnetic field B0), a distance a of the return conductors 20 having an interfering magnetic field that counteracts the compensation magnetic field from the edge area 18 may be at least as large as the named maximum extension e of the detection zone 13, 15.

Figure 7:
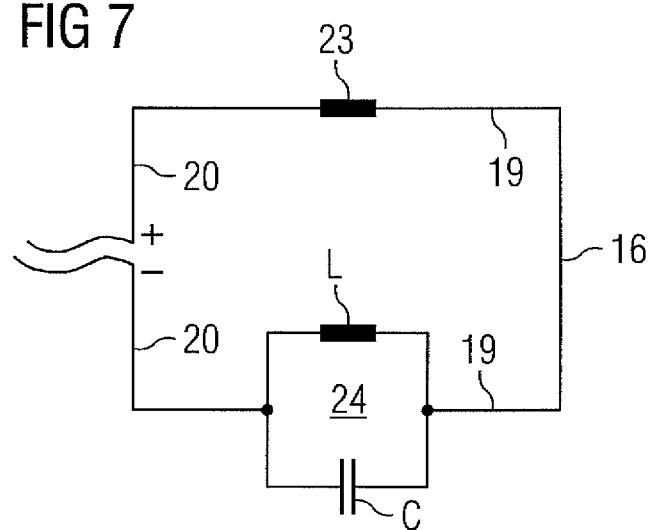
FIG. 7 shows one embodiment of an electric circuit.

In operation, the conductor 16 and at least a part of the return conductors 19, 20 are disposed in the examination volume 2 (e.g., in the homogeneity region 3). Therefore, the conductor 16 and at least a part of the return conductors 19, 20 are exposed to both the gradient fields of the gradient magnetic system 5 and the high-frequency transmission pulses of the whole body coil 7. In one embodiment, as shown in FIG. 7, at least one choke 23 is arranged in the electric circuit formed by the conductor 16 and the return conductors 19, 20. Alternatively or additionally, at least one rejection circuit 24 (e.g., a band-stop filter) matched to the Larmor frequency of the magnetic resonance system may be arranged in the named electric circuit. A rejection circuit is a parallel connection of a coil and a capacitor, where the relationship $$\omega^2 LC = 1$$

applies, and where $\omega=2\pi f$. f is the frequency to be blocked, L is the inductance of the coil, and C is the capacitance of the capacitor.

The present embodiments have advantages over the prior art. For example, in a simple and inexpensive way, locally narrowly restricted residual inhomogeneities of the basic magnetic field B0 may be compensated. In this context, the present embodiments may be combined with larger shim coils with a global action.

Although the invention was illustrated and described by the exemplary embodiments, the invention is not restricted by the disclosed examples. Other variations may be derived by the person skilled in the art without leaving the scope of the invention.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil arrangement for magnetic resonance purposes, the local coil arrangement comprising:
   at least one local coil;
   at least one conductor and associated return conductors; and
   a mechanical holding structure, in which the at least one local coil and the at least one conductor with the associated return conductors are arranged, wherein when the entirety or a portion of the mechanical holding structure surrounds the at least one local coil and is inserted in a homogeneity region of a basic magnetic field of a magnetic resonance system, wherein the local coil or another receive coil is operable to receive magnetic resonance signals originating from a specific detection zone for the local coil arrangement;
   wherein the at least one conductor is exposable to direct current or low-frequency alternating current, the at least one conductor being arranged such that the at least one conductor extends orthogonally to a direction of the basic magnetic field, and wherein the at least one conductor generates a compensation magnetic field when exposed to the direct current or the low-frequency alternating current, the compensation magnetic field comprising field lines that encircle the at least one conductor and form a compensation magnetic field angle with the direction of the basic magnetic field in an edge area of the specific detection zone; and
   wherein the return conductors complete an electric circuit containing the at least one conductor, wherein at least one return conductor, running parallel with the at least one conductor, generates an interfering magnetic field counteracting the compensation magnetic field when exposed to the direct current or the low-frequency alternating current, the interfering magnetic field comprising field lines that encircle the respective return conductor and form an interfering magnetic field angle with the direction of the basic magnetic field in the edge area, the interfering magnetic field angle being larger than the compensation magnetic field angle, and the respective return conductor being further away from the edge area than the at least one conductor,
   wherein the at least one conductor is arranged outside the specific detection zone at an edge of the edge area.

2. The local coil arrangement as claimed in claim 1, wherein the at least one conductor and the return conductors lie in a plane, and
   wherein with a parallel projection of the edge area directed into the plane at a right angle to the plane, the at least one conductor is arranged between at least a part of the edge area and the return conductors with an interfering magnetic field that counteracts the compensation magnetic field.

3. The local coil arrangement as claimed in claim 1, wherein viewed in the direction of the basic magnetic field, the specific detection zone has a maximum extension, and
   wherein viewed in the direction of the basic magnetic field, a distance of the return conductors with an interfering magnetic field that counteracts the compensation magnetic field from the edge area is at least as large as the maximum extension of the specific detection zone.

4. The local coil arrangement as claimed in claim 1, further comprising at least one band-stop filter matched to a Larmor frequency of the magnetic resonance system, at least one choke, or the at least one band-stop filter and the at least one choke, the at least one band-stop filter, the at least one choke, or the at least one band-stop filter and the at least one choke being arranged in the electric circuit containing the at least one conductor and the return conductors.

5. The local coil arrangement as claimed in claim 1, wherein the local coil arrangement is a breast coil arrangement comprising two cup-shaped receptacles for breasts of an object under examination, and wherein the specific detection zone includes at least one of the two cup-shaped receptacles.

6. The local coil arrangement as claimed in claim 5, wherein the at least one conductor is arranged in a region of a lower edge of the two cup-shaped receptacles.

7. The local coil arrangement as claimed in claim 1, wherein the local coil arrangement is a spine coil arrangement.

8. The local coil arrangement as claimed in claim 7, wherein the at least one conductor is arranged in a region of the mechanical holding structure on which a neck of an object under examination lies.

9. The local coil arrangement as claimed in claim 2, wherein viewed in the direction of the basic magnetic field, the specific detection zone has a maximum extension, and
wherein viewed in the direction of the basic magnetic field, a distance of the return conductors with an interfering magnetic field that counteracts the compensation magnetic field from the edge area is at least as large as the maximum extension of the specific detection zone.

10. The local coil arrangement as claimed in claim 2, further comprising at least one band-stop filter matched to a Larmor frequency of the magnetic resonance system, at least one choke, or the at least one band-stop filter and the at least one choke, the at least one band-stop filter, the at least one choke, or the at least one band-stop filter and the at least one choke being arranged in the electric circuit containing the at least one conductor and the return conductors.

11. The local coil arrangement as claimed in claim 3, further comprising at least one band-stop filter matched to a Larmor frequency of the magnetic resonance system, at least one choke, or the at least one band-stop filter and the at least one choke, the at least one band-stop filter, the at least one choke, or the at least one band-stop filter and the at least one choke being arranged in the electric circuit containing the at least one conductor and the return conductors.

12. The local coil arrangement as claimed in claim 2, wherein the local coil arrangement is a breast coil arrangement comprising two cup-shaped receptacles for breasts of an object under examination, and
wherein the specific detection zone includes at least one of the two cup-shaped receptacles.

13. The local coil arrangement as claimed in claim 3, wherein the local coil arrangement is a breast coil arrangement comprising two cup-shaped receptacles for breasts of an object under examination, and
wherein the specific detection zone includes at least one of the two cup-shaped receptacles.

14. The local coil arrangement as claimed in claim 4, wherein the local coil arrangement is a breast coil arrangement comprising two cup-shaped receptacles for breasts of an object under examination, and
wherein the specific detection zone includes at least one of the two cup-shaped receptacles.

15. The local coil arrangement as claimed in claim 2, wherein the local coil arrangement is a spine coil arrangement.

16. The local coil arrangement as claimed in claim 3, wherein the local coil arrangement is a spine coil arrangement.

* * * * *